United States Patent
Noguchi

(10) Patent No.: US 9,200,379 B2
(45) Date of Patent: Dec. 1, 2015

(54) BASE MATERIAL FOR GROWING SINGLE CRYSTAL DIAMOND AND METHOD FOR PRODUCING SINGLE CRYSTAL DIAMOND SUBSTRATE

(71) Applicant: SHIN-ETSU CHEMICAL CO., LTD., Tokyo (JP)

(72) Inventor: Hitoshi Noguchi, Annaka (JP)

(73) Assignee: SHIN-ETSU CHEMICAL CO., LTD., Tokyo, Gunma (JP)

( * ) Notice: Subject to any disclaimer, the term of this patent is extended or adjusted under 35 U.S.C. 154(b) by 0 days.

(21) Appl. No.: 13/888,187

(22) Filed: May 6, 2013

(65) Prior Publication Data

US 2013/0239880 A1 Sep. 19, 2013

Related U.S. Application Data

(62) Division of application No. 12/884,926, filed on Sep. 17, 2010.

(30) Foreign Application Priority Data

Oct. 13, 2009 (JP) .................... 2009-235992

(51) Int. Cl.
*C30B 25/18* (2006.01)
*C30B 25/06* (2006.01)
(Continued)

(52) U.S. Cl.
CPC ............... *C30B 25/183* (2013.01); *C30B 25/06* (2013.01); *C30B 25/18* (2013.01); *C30B 29/02* (2013.01); *C30B 29/04* (2013.01); *C30B 29/16* (2013.01); *C30B 29/36* (2013.01); *C30B 33/08* (2013.01)

(58) Field of Classification Search
CPC ...... C30B 25/06; C30B 25/18; C30B 25/183; C30B 29/02; C30B 29/04
USPC ................................................. 117/2
See application file for complete search history.

(56) References Cited

U.S. PATENT DOCUMENTS 4,396,458 A * 8/1983 Platter et al. .................... 216/19
5,114,745 A 5/1992 Jones
(Continued)

FOREIGN PATENT DOCUMENTS

CN 1478295 A 2/2004
CN 101054720 A 10/2007
(Continued)

OTHER PUBLICATIONS

Li et al., "Epitaxial Growth of an MgO Buffer Layer and Electrode Layer," IEEE, pp. 909-912, 2001.
(Continued)

*Primary Examiner* — Michael Kornakov
*Assistant Examiner* — Hua Qi
(74) *Attorney, Agent, or Firm* — Oliff PLC

(57) ABSTRACT

A base material for growing a single crystal diamond that includes at least a single crystal SiC substrate, and an iridium film or a rhodium film heteroepitaxially grown on a side of the single crystal SiC substrate where the single crystal diamond is to be grown. As a result, there is provided a base material for growing a single crystal diamond and a method for producing a single crystal diamond substrate which can grow the single crystal diamond having a large area and good crystallinity and produce a high quality single crystal diamond substrate at low cost.

4 Claims, 2 Drawing Sheets

(51) Int. Cl.
*C30B 29/02* (2006.01)
*C30B 29/04* (2006.01)
C30B 29/16 (2006.01)
C30B 29/36 (2006.01)
C30B 33/08 (2006.01)

(56) References Cited

U.S. PATENT DOCUMENTS

| | | | |
|---|---|---|---|
| 5,861,135 | A | 1/1999 | Tanabe et al. |
| 7,033,521 | B2 | 4/2006 | Iwashita et al. |
| 7,309,515 | B2 | 12/2007 | Tsai et al. |
| 7,514,146 | B2 | 4/2009 | Noguchi et al. |
| 2004/0029359 | A1 | 2/2004 | Letertre et al. |
| 2005/0155543 | A1* | 7/2005 | Meguro et al. ............ 117/75 |
| 2005/0181210 | A1* | 8/2005 | Doering et al. ............ 428/408 |
| 2005/0220162 | A1 | 10/2005 | Nakamura |
| 2006/0112874 | A1 | 6/2006 | Yokota et al. |
| 2006/0203346 | A1 | 9/2006 | Noguchi et al. |
| 2006/0220514 | A1 | 10/2006 | Tatsumi et al. |
| 2006/0228479 | A1 | 10/2006 | Dahl et al. |
| 2007/0209578 | A1 | 9/2007 | Noguchi |
| 2009/0176114 | A1 | 7/2009 | Sawabe et al. |
| 2009/0221131 | A1 | 9/2009 | Kubota et al. |
| 2009/0308305 | A1 | 12/2009 | Mukuno et al. |
| 2011/0081531 | A1 | 4/2011 | Noguchi |
| 2011/0315074 | A1 | 12/2011 | Noguchi et al. |

FOREIGN PATENT DOCUMENTS

| | | | | |
|---|---|---|---|---|
| CN | 101521155 | A | 9/2009 | |
| JP | A-2-289493 | | 11/1990 | |
| JP | A-06-289145 | | 10/1994 | |
| JP | 07172989 | A * | 7/1995 | ............ C30B 29/04 |
| JP | A-07-172989 | | 7/1995 | |
| JP | A-7-243044 | | 9/1995 | |
| JP | A-09-208387 | | 8/1997 | |
| JP | A-9-208387 | | 8/1997 | |
| JP | A 2002-231996 | | 8/2002 | |
| JP | A-2002-231996 | | 8/2002 | |
| JP | 2005219962 | A * | 8/2005 | ............ C30B 29/04 |
| JP | A-2005-219962 | | 8/2005 | |
| JP | A-2006-248883 | | 9/2006 | |
| JP | A-2007-238377 | | 9/2007 | |
| JP | A-2007-284285 | | 11/2007 | |
| JP | A-2008-031503 | | 2/2008 | |

OTHER PUBLICATIONS

Feb. 5, 2013 Notification of Reasons for Refusal issued in Japanese Application No. 2009-235992 with partial English-language translation.
Gsell et al., "A Route to Diamond Wafers by Epitaxial Deposition on Silicon via Iridium/Yttria-Stabilized Zirconia Buffer Layers," Applied Physics Letters, vol. 84, No. 22, pp. 4541-4543, May 31, 2004.
Jul. 31, 2012 Notification of Reasons for Refusal issued in Japanese Application No. 2009-230776 with partial English-language translation.
Aug. 30, 2012 Chinese Office Action issue in Chinese Application No. 201010226112.0 with partial English-language translation.
Oct. 23, 2012 Notification of Reasons for Refusal issue in Japanese Application No. 2009-230776 with partial English-language translation.
Jan. 8, 2013 Notification of Reasons for Refusal issued in Japanese Application No. 2009-230776 with partial English-language translation.
Jun. 22, 2012 Office Action issued in U.S. Appl. No. 12/876,531.
Jan. 18, 2013 Office Action issued in U.S. Appl. No. 12/876,531.
Nov. 13, 2012 Japanese Office Action issued in Japanese Application No. 2009-235992 (with partial translation).
Aug. 30, 2012 Office Action issued in Chinese Patent Application No. 201010266110.1 (with translation).
Bauer et al., "Growth of epitaxial diamond on silicon via iridium/SrTiO$_3$ buffer layers," Diamond & Related Materials, vol. 14, pp. 314-317, 2005.
Jul. 31, 2012 Japanese Office Action issued in Japanese Application No. 2009-235992 (with partial translation).
K. Ohtsuka et al, "Epitaxial Growth of Diamond on Iridium," Jpn. J. Appl. Phys., (1996), pp. 1072-1074, vol. 35, No. 8B.
Y. Mokuno et al, "High-rate growth of single crystalline diamond using microwave plasma," Diamond Research Center, National Institute of Advanced Industrial Science and Technology, 20$^{th}$ Diamond Symposium Lecture Summary, Nov. 21-22, 2006, pp. 6-7.
Apr. 23, 2013 Final Notification of Reasons for Refusal issued in Japanese Application No. 2009-235992 with partial English-language translation.
Apr. 3, 2013 Decision to Dismiss an Amendment issued in Japanese Application No. 2009-230776 with partial English-language translation.
Apr. 16, 2013 Notification of Reasons for Refusal issued in Japanese Application No. 2010-264261 with partial English-language translation.
Sep. 26, 2013 Taiwanese Office Action issued in Taiwanese Application No. 100122464 with partial English-language translation.
Jul. 23, 2013 Chinese Office Action issued in Chinese Application No. 201110177039.7 with partial English-language translation.
Sep. 20, 2013 Office Action issued in U.S. Appl. No. 13/159,074.
Sep. 26, 2014 Office Action issued in U.S. Appl. No. 13/159,074.
Jul. 7, 2014 Office Action issued in Chinese Application No. 201110177039.7 (with partial English translation).
Jan. 22, 2014 Office Action issued in U.S. Appl. No. 13/159,074.
Jun. 9, 2014 Office Action issued in U.S. Appl. No. 13/159,074.
Sep. 3, 2013 Notification of Reasons for Refusal issued in Japanese Application No. 2010-264261 with partial English-language translation.
Sep. 4, 2015 Office Action issued in U.S. Appl. No. 13/846,540.

* cited by examiner (a)

(b)

BASE MATERIAL FOR GROWING SINGLE CRYSTAL DIAMOND AND METHOD FOR PRODUCING SINGLE CRYSTAL DIAMOND SUBSTRATE

CROSS-REFERENCE TO PRIOR APPLICATIONS

This is a divisional of application Ser. No. 12/884,926 filed Sep. 17, 2010, and claims the benefit of Japanese Patent Application No. 2009-235992 filed Oct. 13, 2009. The entire disclosures of the prior applications are hereby incorporated by reference herein in their entirety.

BACKGROUND OF THE INVENTION

1. Field of the Invention

The present invention relates to a base material for growing a single crystal diamond and a method for producing a single crystal diamond substrate.

2. Description of the Related Art

Diamond has a wide band gap of 5.47 eV and a very high dielectric breakdown electric field intensity of 10 MV/cm, and it has the highest thermal conductivity in materials. Therefore, if this is used for an electronic device, the device is advantageous as a high output power device.

Furthermore, the diamond has a high drift mobility and is the most advantageous as a high speed power device among semiconductors in comparison of Johnson performance index.

The diamond is thus said to be the ultimate semiconductor suitable for high frequency/high power electronic devices, and accordingly studies of various kinds of electronic devices using a single crystal diamond as a substrate have progressed.

Now, a single crystal diamond for producing a diamond semiconductor is, in many cases, the diamond referred to as an Ib type formed by a high-pressure-high-temperature method (HPHT) or an IIa type of which purity is enhanced.

However, it is difficult to grow in size, while the HPHT single crystal diamond having high crystallinity can be obtained. In addition, a price of the diamond becomes extremely high when its size becomes big and consequently, it is difficult to put it into practical use as the substrate for the devices.

In view of this, a CVD single crystal diamond formed by a vapor deposition method has been also studied to provide a low-cost single crystal diamond substrate having a large area.

Recently, there was reported a homoepitaxial CVD single crystal diamond that is homoepitaxially grown directly on the HPHT single crystal diamond base material (a seed base material) by the vapor deposition method (the 20th diamond symposium lecture summary (2006), pp. 6-7).

However, in this method, since the base material and the single crystal diamond grown are composed of the same material, it is difficult to separate these, and there are cost problems that the base material needs implanting ions in advance, a lengthy wet etching separation treatment after the growth and the like. There is also another problem that crystallinity of the single crystal diamond to be obtained deteriorates to a certain degree due to the ion implantation of the base material.

As an alternative, there was reported a CVD single crystal diamond heteroepitaxially grown by a CVD method on a single crystal iridium (Ir) film heteroepitaxially grown on a single crystal MgO base material (the seed base material) (Jpn. J. Appl. Phys. Vol. 35 (1996), pp. L1072-L1074).

However, in this method, there is a problem that the base material and the single crystal diamond grown are finely broken due to stress generated between the single crystal MgO substrate and the single crystal diamond grown via the single crystal Ir film (sum of internal stress and heat stress). Moreover, the crystallinity of the single crystal diamond to be obtained does not achieve a satisfactory level since crystallinity of an available single crystal MgO that is the seed base material is not sufficient.

SUMMARY OF THE INVENTION

The present invention was accomplished in view of the aforementioned problems, and it is an object of the present invention to provide a base material for growing a single crystal diamond and a method for producing a single crystal diamond substrate which can grow the single crystal diamond having a large area and good crystallinity and produce a high quality single crystal diamond substrate at low cost.

In order to accomplish the above object, the present invention provides a base material for growing a single crystal diamond comprising: at least a single crystal SiC substrate; and an iridium film or a rhodium film heteroepitaxially grown on a side of the single crystal SiC substrate where the single crystal diamond is to be grown.

In case of the single crystal SiC substrate as described above, since the single crystal SiC substrate having good crystallinity can be obtained at relatively low cost, a good epitaxial growth can be performed on the substrate surface and crystallinity of the iridium film or the rhodium film becomes good by growing it directly or through other layers. The single crystal diamond having high crystallinity can be thereby obtained by growing the single crystal diamond on the base material having good crystallinity. Moreover, in case of the single crystal SIC substrate, since the thermal expansion coefficient of SiC is relatively near to that of diamond, the stress generated due to thermal expansion is small during the growth of the single crystal diamond, and the single crystal diamond and the base material are scarcely broken. When the base material has the iridium film or the rhodium film on the single crystal SiC substrate, it functions as a good buffer layer during the growth of the single crystal diamond.

As described above, the base material for growing a single crystal diamond according to the present invention can grow the single crystal diamond having a large area and high crystallinity at low cost.

In this case, crystal structure of the single crystal SiC substrate is preferably cubic β-SiC.

In this manner, when the crystal structure of the single crystal SiC substrate is cubic β-SiC, the base material can grow the single crystal diamond having higher crystallinity.

In this case, a thickness of the single crystal SiC substrate is preferably 0.03 mm to 20.00 mm.

The single crystal SiC substrate having the thickness as described above enables handling to make easy, and when the thickness is 20.00 mm or less, a double-side polishing and the like can be performed well and cost is not excessive.

In this case, the iridium film or the rhodium film can be heteroepitaxially grown by a sputtering method.

In this manner, the iridium film or the rhodium film of the base material according to the present invention can be heteroepitaxially grown by the sputtering method.

In this case, a thickness of the iridium film or the rhodium film is preferably 5 Å to 100 μm.

In this manner, when the thickness of the iridium film or the rhodium film is 5 Å or more, film thickness uniformity and the crystallinity is sufficiently high. When the thickness is 100 μm or less, the stress generated between the base material and the single crystal diamond is small, thereby the single crystal diamond can be surely grown and moreover the base material becomes low-cost.

In this case, a surface of the iridium film or the rhodium film is preferably subjected to a bias treatment.

In this manner, the base material subjected to the bias treatment forms a diamond nucleus on its surface and can thereby grow the single crystal diamond with good crystallinity at a sufficient growth rate.

In this case, the base material preferably comprises a MgO film heteroepitaxially grown between the single crystal SiC substrate and the iridium film or the rhodium film.

In this manner, when the base material according to the present invention comprises the MgO film, the iridium film or the rhodium film can be formed thereon with better crystallinity. In addition, in the case of separating the grown single crystal diamond, the MgO film can be used as a good separation layer, and thereby the base material can be easily separated to provide a single crystal diamond substrate.

In this case, the MgO film can be heteroepitaxially grown on the single crystal SiC substrate by a sputtering method or an electron beam evaporation method.

In this manner, the MgO film of the base material according to the present invention can be grown by the sputtering method or the electron beam evaporation method.

In this case, a thickness of the MgO film is preferably 5 Å to 100 μm.

In this manner, when the thickness of the MgO film is 5 Å or more, film thickness uniformity and the crystallinity become higher. When the thickness is 100 μm or less, the stress generated between the base material and the single crystal diamond is small, thereby the single crystal diamond can be surely grown and moreover the base material becomes low-cost.

Furthermore, the present invention provides a method for producing a single crystal diamond substrate comprising at least the steps of: preparing a single crystal SIC substrate; heteroepitaxially growing an iridium film or a rhodium film over the prepared single crystal SiC substrate; heteroepitaxially growing a single crystal diamond on the iridium film or the rhodium film heteroepitaxially grown; and separating the single crystal diamond heteroepitaxially grown to obtain the single crystal diamond substrate.

In case of the single crystal SiC substrate as described above, the substrate having good crystallinity can be prepared at low cost, the iridium film or the rhodium film can be grown over the single crystal SiC substrate with good crystallinity, and the single crystal diamond having high crystallinity can be grown on the iridium film or rhodium film having good crystallinity. Moreover, in case of the single crystal SiC substrate, since the stress due to thermal expansion generated during the growth of the single crystal diamond is small, both of the single crystal SIC substrate and the single crystal diamond are scarcely broken.

As described above, the method for producing according to the present invention can efficiently produce the single crystal diamond substrate having high crystallinity at low cost.

In this case, it is preferable that the step of heteroepitaxially growing a MgO film on the single crystal SiC substrate is performed before the step of heteroepitaxially growing the iridium film or the rhodium film and the iridium film or the rhodium film is heteroepitaxially grown on the MgO film.

In this manner, when the MgO film is grown before the iridium film or the rhodium film is grown, the iridium film or the rhodium film can be grown thereon with better crystallinity. In addition, the single crystal diamond can be easily separated by using the MgO film as a separation layer in the step of the separation.

In this case, before the step of heteroepitaxially growing the single crystal diamond, a bias treatment is preferably preliminarily performed on a surface of the iridium film or the rhodium film.

In this manner, when the bias treatment is preliminarily performed, a diamond nucleus is formed on the surface and the single crystal diamond can be grown with good crystallinity at a sufficient growth rate.

In this case, the single crystal diamond can be heteroepitaxially grown by a microwave CVD method or a direct-current plasma CVD method in the step of heteroepitaxially growing the single crystal diamond.

In this manner, the single crystal diamond can be heteroepitaxially grown by the microwave CVD method or the direct-current plasma CVD method in the method for producing according to the present invention.

As described above, the base material for growing a single crystal diamond and the method for producing a single crystal diamond substrate according to the present invention can grow the single crystal diamond having a large area and high crystallinity at low cost and produce a high quality single crystal diamond substrate at good productivity.

DETAILED DESCRIPTION OF THE PREFERRED EMBODIMENTS

Conventionally, in an attempt to obtain the single crystal diamond by a cost-advantageous CVD method, there are problems that a portion of the single crystal diamond grown cannot be easily separated without damage and it is difficult to grow the single crystal diamond having high crystallinity and a large area. Accordingly, the present inventor repeatedly keenly conducted studies on a type and structure of the base material and a method for producing a single crystal.

As a result, the present inventor found that when the single crystal SiC substrate, in which the difference in a linear expansion coefficient from the diamond is relatively small, is used as the seed base material, which mainly generates the stress at an interface between a single crystal diamond layer and the base material, the stress generated due to thermal expansion is smaller in comparison with the case of using a conventional MgO seed base material and that a break of all of them can be consequently prevented (the linear expansion coefficient diamond: $1.1 \times 10^{-6}$/K, SiC:$6.6 \times 10^{-6}$/K, MgO: $13.8 \times 10^{-6}$/K).

In addition, the single crystal SiC substrate having higher crystallinity in comparison with the conventional MgO seed base material can be relatively easily obtained, and when the single crystal SiC substrate is used as the seed base material, the single crystal Ir (iridium) film or the single crystal Rh (rhodium) film can be heteroepitaxially grown over the substrate with good crystallinity. The present inventor also found that when these high crystallinity materials are used for the base material and the single crystal diamond is heteroepitaxially grown thereon by the CVD method, the single crystal diamond having high crystallinity can be obtained. The present inventor further confirmed that the single crystal diamond grown on this base material can be also separated by a wet etching method and a mechanical polishing method, and brought the present invention to completion.

Hereinafter, an example of embodiments of the present invention will be explained in detail with reference to the drawings. However the present invention is not restricted thereto.

Figure 1:
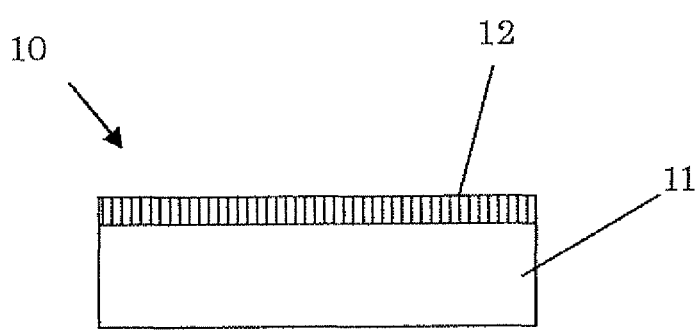
FIG. 1 are schematic views showing an example of embodiments of the base material for growing a single crystal diamond according to the present invention.
Figure 1:
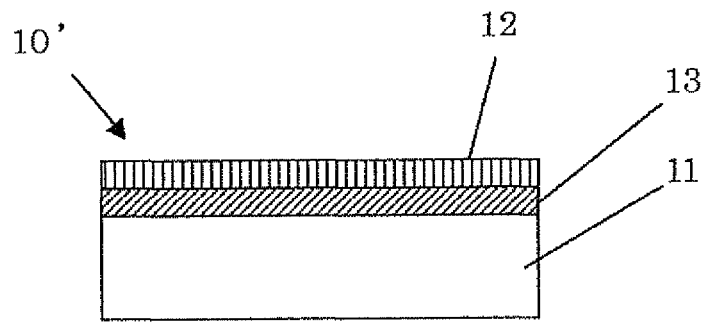
Figure 2:
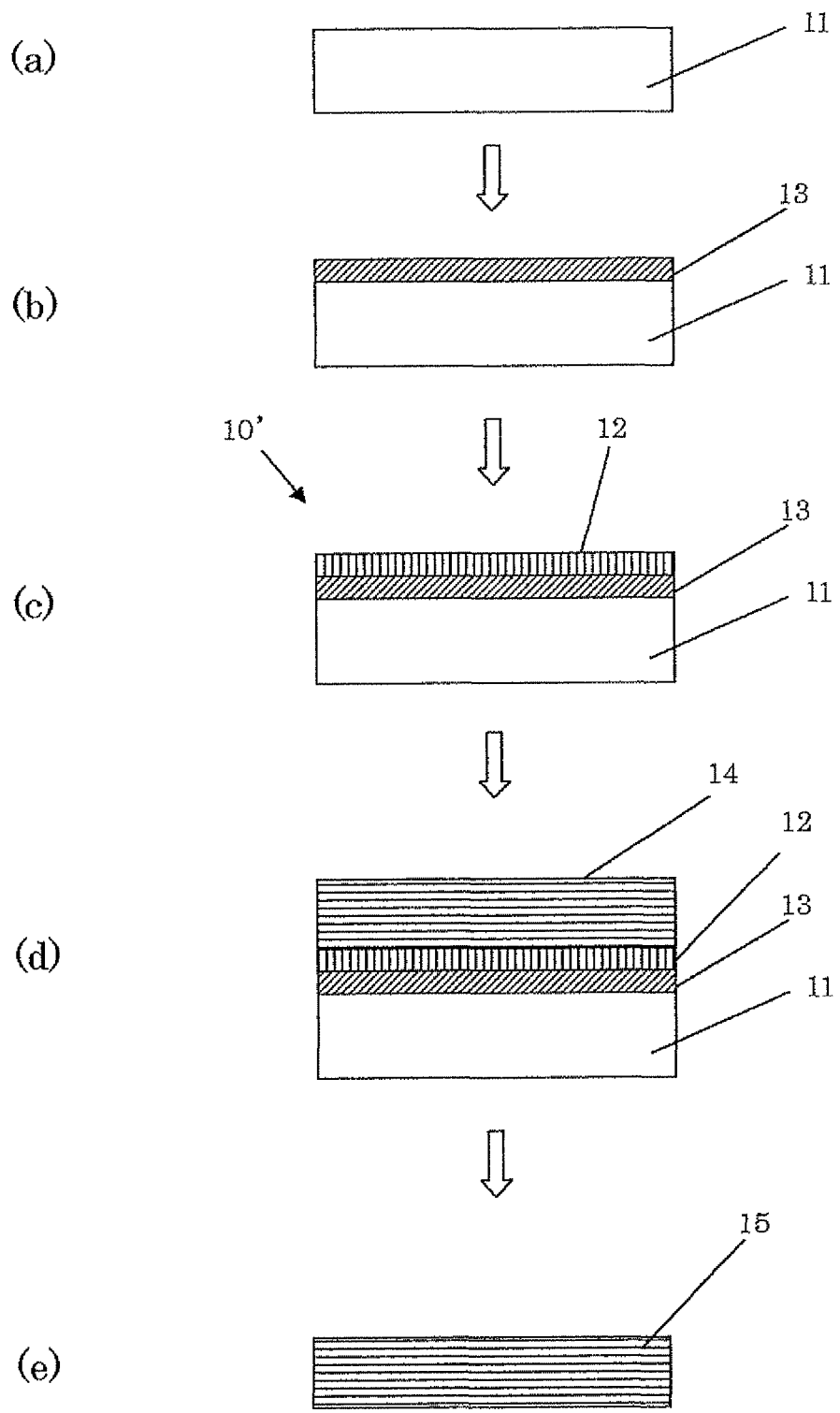
FIG. 2 are flow charts showing an example of embodiments of the method for producing a single crystal diamond substrate according to the present invention.

FIG. 1 are schematic views showing an example of embodiments of the base material for growing a single crystal diamond according to the present invention. FIG. 2 are flow charts showing an example of embodiments of the method for producing a single crystal diamond substrate according to the present invention.

The base material for growing a single crystal diamond 10 according to the present invention as shown in FIG. 1(a) comprises the single crystal SIC substrate 11, the iridium film or the rhodium film 12 heteroepitaxially grown on the side of the single crystal SiC substrate 11 where the single crystal diamond is to be grown.

In the event that the seed base material is the single crystal SiC substrate as described above, since the single crystal SiC substrate having good crystallinity can be obtained at low cost, the iridium film or the rhodium film grown directly or through other layers on the substrate surface having good crystallinity has good crystallinity. The single crystal diamond having high crystallinity can be obtained by growing the single crystal diamond on the base material. Moreover, in case of the single crystal SiC substrate, since the thermal expansion coefficient of SiC is relatively near to that of diamond, the single crystal diamond and the base material itself are scarcely broken by the stress due to thermal expansion during the growth of the single crystal diamond and the like. When the base material has the iridium film or the rhodium film on the single crystal SiC substrate, it functions as a good buffer layer during the growth of the single crystal diamond.

On the other hand, the base material for growing a single crystal diamond 10' according to the present invention as shown in FIG. 1(b) comprises the MgO film 13 heteroepitaxially grown between the single crystal SiC substrate 11 and the iridium film or the rhodium film 12.

As described above, when the base material according to the present invention has the MgO film, the iridium film or the rhodium film can be formed thereon with better crystallinity. In addition, in the case of separating the grown single crystal diamond, the MgO film can be used as a good separation layer, and thereby the base material can be easily separated to provide the single crystal diamond substrate.

Hereinafter, an example of a method of fabricating the base material for growing a single crystal diamond as described above and the method for producing a single crystal diamond substrate according to the present invention will be explained with reference to FIG. 2.

First, as shown in FIG. 2(a), the single crystal SiC substrate 11 is prepared in the present invention. As described above, when the single crystal SiC substrate is used as the seed base material, the single crystal SiC substrate having higher crystallinity in comparison with the conventional MgO seed base material can be relatively easily obtained, and thereby a good epitaxial growth can be performed on the substrate surface.

In this case, the single crystal SiC substrate 11 to be prepared is not restricted in particular, but its crystal structure is preferably cubic β-SiC.

As described above, when the crystal structure of the single crystal SiC substrate is cubic β-SiC, the base material can grow the single crystal diamond having better crystallinity.

Next, as shown in FIG. 2(b), the MgO film 13 is preferably heteroepitaxially grown on the single crystal SiC substrate 11, for example, by the sputtering method or the electron beam evaporation method.

As described above, when the MgO film is formed, the iridium film or the rhodium film can be grown thereon with better crystallinity. In addition, at the time of separating the single crystal diamond in a subsequent step, the MgO film, which has relatively low chemical resistance, can be used as the separation layer, and the single crystal diamond can be easily separated by etching of the MgO film portion. Although the linear expansion coefficient of the MgO is greatly different from that of the diamond, the MgO is a form of a film in the present invention and can thereby absorb the stress, and it does not particularly become issue with regard to the growth of the single crystal diamond.

Growth conditions and the like are not restricted in particular, but the thickness of the MgO film 13 is preferably 5 Å to 100 μm.

As described above, when the thickness of the MgO film is 5 Å or more, the film thickness uniformity and the crystallinity can be made high. When the thickness is 100 μm or less, the stress generated between the seed base material portion and the single crystal diamond is small, thereby the single crystal diamond can be more surely grown, and moreover the base material becomes cost-advantageous and low-cost.

However, it is not necessarily to form the MgO film in the present invention.

Next, as shown in FIG. 2(c), the iridium film or the rhodium film 12 is heteroepitaxially grown, for example, by the sputtering method.

In this case, the growth conditions and the like are not restricted in particular. For example, it can be grown at a sufficient growth rate by the R. F. magnetron sputtering method. In the event that the MgO film 13 is not formed in a previous step, the iridium film or the rhodium film 12 can be also directly grown on a surface of the single crystal SiC substrate 11. Since the single crystal SiC substrate that is the seed base material has good crystallinity, the iridium film or the rhodium film 12 grown as described above can be easily grown directly on the substrate surface or through the MgO film with good crystallinity.

The thickness of the iridium film or the rhodium film 12 is preferably 5 Å to 100 μm.

As described above, when the thickness of the iridium film or the rhodium film is grown up to 5 Å or more, the film thickness uniformity and the crystallinity can be made higher. When the thickness is 100 μm or less, the stress generated between the base material and the single crystal diamond is small, thereby the single crystal diamond can be more surely grown and moreover the cost can be reduced.

The base material for growing a single crystal diamond 10' according to the present invention in the case of growing the MgO film 13 can be fabricated by the foregoing way.

Here, before the growth of the single crystal diamond in a subsequent step, the bias treatment is preferably performed on the surface of the iridium film or the rhodium film 12 of the base material for growing a single crystal diamond 10'.

This bias treatment first performs a pretreatment for forming the diamond nucleus by a direct-current discharge in which an electrode of the base material side is set at a cathode in advance so that the diamond nucleus having a uniform crystal orientation on the surface of the iridium film or the rhodium film is formed, for example, by the method as described in Japanese Patent Laid-open (Kokai) No. 2007-

238377. Accordingly, the single crystal diamond can be grown with good crystallinity at a sufficient growth rate in a subsequent step.

Next, as shown in FIG. 2(d), the single crystal diamond 14 is heteroepitaxially grown, for example, by the microwave CVD method or the direct-current plasma CVD method.

As described above, in the case of growing the single crystal diamond on the base material according to the present invention, since the single crystal SiC substrate is used as the seed base material, which is the thickest among the base material and is apt to generate the stress due to thermal expansion, the stress is hard to generate during the growth of the single crystal diamond and the break can be prevented. In addition, since the iridium film or the rhodium film has good crystallinity, the single crystal diamond having high crystallinity can be grown.

Next, as shown in FIG. 2(e), the single crystal diamond substrate 15 is obtained by separating the single crystal diamond 14.

The method of separating it is not restricted in particular. For example, after dividing it into the single crystal diamond/the iridium film or the rhodium film and the MgO film/the single crystal SiC substrate by immersing it into the wet etching solution such as phosphoric acid solution, hot mixed acid or the like, the single crystal diamond substrate can be obtained by removing the remaining iridium film or the rhodium film by the mechanical polishing method. As described above, the single crystal diamond can be easily separated by using the MgO film as the separation layer. In the case of not growing the MgO film, since the single crystal SiC substrate, the iridium film and the rhodium film are composed of high chemical resistance materials, it is difficult to separate the single crystal diamond by etching. In this case, the iridium film/the single crystal SiC substrate may be removed by a mechanical polishing method at once or it may be cut with laser at the vicinity of the interfaces between the single crystal diamond and the iridium film or the rhodium film, without immersing it into the wet etching solution. The method of the separation by the polishing or the laser can be also applied in the case of forming the MgO film.

In the present invention, when the MgO film 13 is used as the separation layer or the cutting with the laser is performed in the step of the separation, the single crystal SiC substrate 11 after the separation can be reused as the seed base material by performing polishing until its surface is approximately exposed. This enables production cost of the single crystal diamond substrate to be more reduced.

Using the base material for growing a single crystal diamond and the method for producing a single crystal diamond substrate according to the present invention as described above enables the single crystal diamond substrate having a large area and high crystallinity, which is usable for device application, to be produced at low cost.

EXAMPLES

Hereinafter, the present invention will be more specifically explained by showing Examples and Comparative Examples. However, the present invention is not restricted thereto.

Example 1

As the seed base material, there was prepared a double-side-polished single crystal β-SiC substrate having a diameter of 20.0 mm, a thickness of 0.25 mm and an orientation (100). The MgO film having a thickness of 0.1 μm was epitaxially grown, by the electron beam evaporation method, on the side of the seed base material where the single crystal diamond was to be grown in a vacuum under the conditions of a substrate temperature of 800° C.

Next, the iridium (Ir) film was heteroepitaxially grown on the single crystal MgO film. The film-forming was completed by performing the sputtering with the R. F. magnetron sputtering method in which an target was Ir under the conditions of an Ar gas of 8 Pa ($6 \times 10^{-2}$ Torr) and a substrate temperature of 700° C., until a thickness of the single crystal Ir film became 1.5 μm.

For the sake of electrical continuity in the bias treatment and the direct-current plasma CVD, the Ir film having a thickness of 1.5 μm was also grown on a back surface under the same conditions except for making the base material temperature 100° C.

Next, the bias treatment was performed for forming the diamond nucleus on the surface of the single crystal Ir film of the base material.

First, the base material was placed on a negative voltage-applying electrode (cathode) of a bias treatment apparatus, and then vacuum exhaust was performed. Next, after the base material was heated to 600° C., a hydrogen-diluted methane gas of 3 vol. % was introduced so that pressure became 160 hPa (120 Torr). Then, the bias treatment was performed. That is, DC voltage was applied to both the electrodes to apply a prescribed DC electricity.

Finally, the single crystal diamond was heteroepitaxially grown on the base material subjected to the bias treatment at 900° C. for 30 hours by the direct-current plasma CVD method.

After finishing the growth, a product taken out from a bell jar was a laminated structure of the diamond/Ir/MgO/SiC without the break. It was divided into the diamond/Ir and the MgO/SiC by the wet etching with hot mixed acid. Then, the Ir film was removed by the mechanical polishing method to get self-standing structure of the single crystal diamond (the single crystal diamond substrate). The surface was also subjected to a final polishing so that it was finished so as to have surface roughness of a usable level for device application.

It was confirmed that the obtained single crystal diamond substrate had sufficient crystallinity as a result of evaluation by raman spectroscopy, XRD rocking curve, X-sectional TEM and cathodoluminescence (CL).

On the other hand, the base material after the separation was polished until a clean surface of the single crystal SiC was approximately exposed so that it was able to be reused as the single crystal SiC substrate of the seed base material.

Example 2

Except for heteroepitaxially growing the Ir film directly without forming the MgO film on the β-SiC substrate that was the seed base material, the single crystal diamond was heteroepitaxially grown as with Example 1.

A product taken out from the bell jar was a laminated structure of the diamond/Ir/SiC without the break. In this case, since the product was composed of only high chemical resistance materials and was not able to separate by the wet etching with hot mixed acid, it was cut with laser at the vicinity of the interfaces between the diamond and the Ir to get self-standing structure of the single crystal diamond (the single crystal diamond substrate). The surface was also subjected to a final polishing so that it was finished so as to have surface roughness of a usable level for device application.

It was confirmed that the obtained single crystal diamond substrate had sufficient crystallinity as a result of evaluation by raman spectroscopy, XRD rocking curve, X-sectional TEM and cathodoluminescence (CL).

On the other hand, the base material after the separation was polished until a clean surface of the single crystal SiC was approximately exposed so that it was able to be reused as the single crystal SiC substrate of the seed base material.

Comparative Example 1

Except for using a double-side-polished single crystal MgO substrate having a 5.0 mm square, a thickness of 0.5 mm and an orientation (100) as the seed base material, there was prepared the base material by the Ir growth and the bias treatment, and the single crystal diamond was heteroepitaxially grown thereon by the direct-current plasma CVD method as with Example 1.

Then, the bell jar was opened to observe the product in the chamber. As a result, both of the base material and a portion of the single crystal diamond were broken into fine pieces having an approximate 1.0 mm square. One of the pieces was taken out and its crystallinity was evaluated. As a result, it was observed that raman full width at half maximum was wide, a lot of dislocation defects existed in X-sectional TEM and the like and thus the crystallinity was an insufficient level for device application.

Comparative Example 2

Except for using a double-side-polished single crystal MgO substrate having a 5.0 mm square, a thickness of 120 μm and an orientation (100) as the seed base material, there was prepared the base material by the Ir growth and the bias treatment, and the single crystal diamond was heteroepitaxially grown thereon by the direct-current plasma CVD method as with Example 1.

Then, the bell jar was opened to observe the product in the chamber. As a result, both of the base material and a portion of the single crystal diamond were broken into fine pieces having an approximate 1.0 mm square.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method for producing a single crystal diamond substrate comprising at least the steps of:
    preparing a single crystal SiC substrate;
    heteroepitaxially growing a first film on an entire upper surface of the prepared single crystal SiC substrate, the first film being a MgO film that is used as a separation layer;
    heteroepitaxially growing a second film on an upper surface of the first film, the second film being an iridium film or a rhodium film;
    heteroepitaxially growing a single crystal diamond on an upper surface of the second film to obtain a laminated structure comprising the single crystal SiC substrate, the first film, the second film, and the heteroepitaxially grown single crystal diamond; and
    separating the heteroepitaxially grown single crystal diamond from the upper surface of the second film to obtain the single crystal diamond substrate;
    wherein the step of separating comprises:
        separating the first film from the second film by immersing the laminated structure into a wet etching solution and etching the MgO film that was formed on the entire upper surface of the prepared single crystal SiC substrate, and then removing remaining second film from the single crystal diamond by mechanical polishing to obtain the single crystal diamond substrate.

2. The method for producing a single crystal diamond substrate according to claim 1, wherein before the step of heteroepitaxially growing the single crystal diamond, a bias treatment is preliminarily performed on a surface of the second film.

3. The method for producing a single crystal diamond substrate according to claim 2, wherein the single crystal diamond is heteroepitaxially grown by a microwave CVD method or a direct-current plasma CVD method.

4. The method for producing a single crystal diamond substrate according to claim 1, wherein the single crystal diamond is heteroepitaxially grown by a microwave CVD method or a direct-current plasma CVD method.

* * * * *